US011907855B2

(12) United States Patent
Persson et al.

(10) Patent No.: US 11,907,855 B2
(45) Date of Patent: Feb. 20, 2024

(54) DATA TRANSFERS IN NEURAL PROCESSING

(71) Applicant: Arm Limited, Cambridge (GB)

(72) Inventors: Erik Persson, Lund (SE); Stefan Johannes Frid, Lund (SE); Elliot Maurice Simon Rosemarine, Cambridge (GB)

(73) Assignee: Arm Limited, Cambridge (GB)

( * ) Notice: Subject to any disclaimer, the term of this patent is extended or adjusted under 35 U.S.C. 154(b) by 767 days.

(21) Appl. No.: 16/834,948

(22) Filed: Mar. 30, 2020

(65) Prior Publication Data

US 2021/0304012 A1 Sep. 30, 2021

(51) Int. Cl.
*G06N 3/10* (2006.01)
*G06N 3/04* (2023.01)

(52) U.S. Cl.
CPC ............ *G06N 3/10* (2013.01); *G06N 3/04* (2013.01)

(58) Field of Classification Search
CPC .......... G06N 3/10; G06N 3/04; G06N 3/0445; G06N 3/063; G06N 3/0454; G11C 5/025; G11C 8/06; G11C 8/12
See application file for complete search history.

(56) References Cited

U.S. PATENT DOCUMENTS

| 11,227,358 | B2* | 1/2022 | Anantaraman | G06F 9/54 |
| 11,361,496 | B2* | 6/2022 | Maiyuran | G06F 9/30065 |
| 2007/0233477 | A1* | 10/2007 | Halowani | H03M 7/30 704/232 |
| 2021/0287431 | A1* | 9/2021 | Woop | G06T 3/4007 |

* cited by examiner

*Primary Examiner* — Ajay Ojha
(74) *Attorney, Agent, or Firm* — EIP US LLP

(57) ABSTRACT

A computer implemented method of storing and retrieving feature map data of a neural network the method comprising receiving a first portion of feature map data from local storage, selecting a first set of subportions of the first portion of feature map data, compressing the subportions to produce a first plurality of sections of compressed feature map data and instructing the storage of the sections into external storage. The method also comprises receiving a second plurality of sections of compressed feature map data from the external storage, decompressing the sections to produce a second set of subportions of the second portion of feature map data and storing the second portion of feature map data in local storage. The first and second sets of subportions each correspond to a predetermined format of subdivision and the method comprises selecting the predetermined format of subdivision from a plurality of predetermined formats of subdivision.

16 Claims, 8 Drawing Sheets

DATA TRANSFERS IN NEURAL PROCESSING

BACKGROUND OF THE INVENTION

Field of the Invention

The present disclosure relates to methods, apparatus and computer software for transferring data in a data processing system. The disclosure has particular, but not exclusive, relevance for transferring data within a data processing system used to process a neural network.

Description of the Related Technology

Neural processing systems may contain a neural processing unit (NPU). NPUs, also known as neural processors, neural network accelerators and AI accelerators, are used to accelerate machine learning algorithms. Neural networks contain neural network layers with different types of feature map data. For example, a convolutional layer contains an input feature map (IFM) which is convolved with weight data to produce an output feature map (OFM). Neural networks also contain other layer types such as input, output, recurrent neural network, deconvolution, pooling, activation and fully connected. Processing these layers typically involves the transfer of large amounts of data between local storage circuitry and external storage circuitry using a great number of memory accesses including the reading and writing of data.

SUMMARY

According to a first aspect of the present disclosure, there is provided a computer implemented method of storing and retrieving feature map data of a neural network the method comprising transferring feature map data between local storage and external storage by:
  receiving a first portion of feature map data from the local storage, the first portion of feature map data being representative of a respective first part of a feature map, the feature map having at least height, width and depth dimensions;
  selecting a first set of subportions of the first portion of feature map data;
  compressing the subportions of feature map data to produce a first plurality of sections of compressed feature map data, each section corresponding to a respective subportion;
  instructing the storage of the first plurality of sections of compressed feature map data into the external storage;
  receiving a second plurality of sections of compressed feature map data from the external storage, the second plurality of sections corresponding to a second portion of feature map data, the second portion of feature map data being representative of a respective second part of the feature map;
  decompressing the second plurality of sections to produce a second set of subportions of the second portion of feature map data; and
  storing the second portion of feature map data in local storage,
  wherein the first and second sets of subportions each correspond to a predetermined format of subdivision, in terms of height, width and depth, of the feature map and the method comprises selecting the predetermined format of subdivision from a plurality of predetermined formats of subdivision.

According to a second aspect of the present disclosure there is provided a non-transitory computer-readable storage medium comprising a set of computer-readable instructions stored thereon which, when executed by at least one processor, cause the at least one processor to:
  select a predetermined format of subdivision in terms of height, width and depth of a feature map having at least height, width and depth dimensions, from a plurality of predetermined formats of subdivision, corresponding to a first set of subportions of a first portion of feature map data of a neural network, the first portion of feature map data being representative of a first part of the feature map; and
  schedule the transfer of the transfer of the feature map data between local storage and external storage using the selected predetermined format of subdivision;
  wherein the feature map data of the neural network is to be transferred between local storage and external storage by:
    receiving the first portion of feature map data from the local storage;
    selecting the first set of subportions of the first portion of feature map data;
    compressing the subportions of feature map data to produce a first plurality of sections of compressed feature map data, each section corresponding to a respective subportion;
    instructing the storage of the first plurality of sections of compressed feature map data into external storage;
    receiving a second plurality of sections of compressed feature map data from the external storage, the second plurality of sections corresponding to a second portion of feature map data, the second portion of feature map data being representative of a respective second part of the feature map;
    decompressing the second plurality of sections to produce a second set of subportions of the second portion of feature map data; and
    storing the second portion of feature map data in local storage.

According to a third aspect, there is provided a data processing system comprising local and external storage circuitry arranged to store feature map data of a neural network, and processing circuitry arranged to:
  receive a first portion of feature map data from local storage, the first portion of feature map data being representative of a respective first part of a feature map, the feature map having at least height, width and depth dimensions;
  select a first set of subportions of the first portion of feature map data;
  compress the subportions of feature map data to produce a first plurality of sections of compressed feature map data, each section corresponding to a respective subportion;
  instruct the storage of the first plurality of sections of compressed feature map data into the external storage;
  receive a second plurality of sections of compressed feature map data from the external storage, the second plurality of sections corresponding to a second portion of feature map data, the second portion of feature map data being representative of a respective second part of the feature map;

decompress the second plurality of sections to produce a second set of subportions of the second portion of feature map data; and store the second portion of feature map data in local storage, wherein the first and second sets of subportions each correspond to a predetermined format of subdivision, in terms of height, width and depth, of the feature map and the method comprises selecting the predetermined format of subdivision from a plurality of predetermined formats of subdivision.

DETAILED DESCRIPTION OF CERTAIN INVENTIVE EMBODIMENTS

Figure 1:
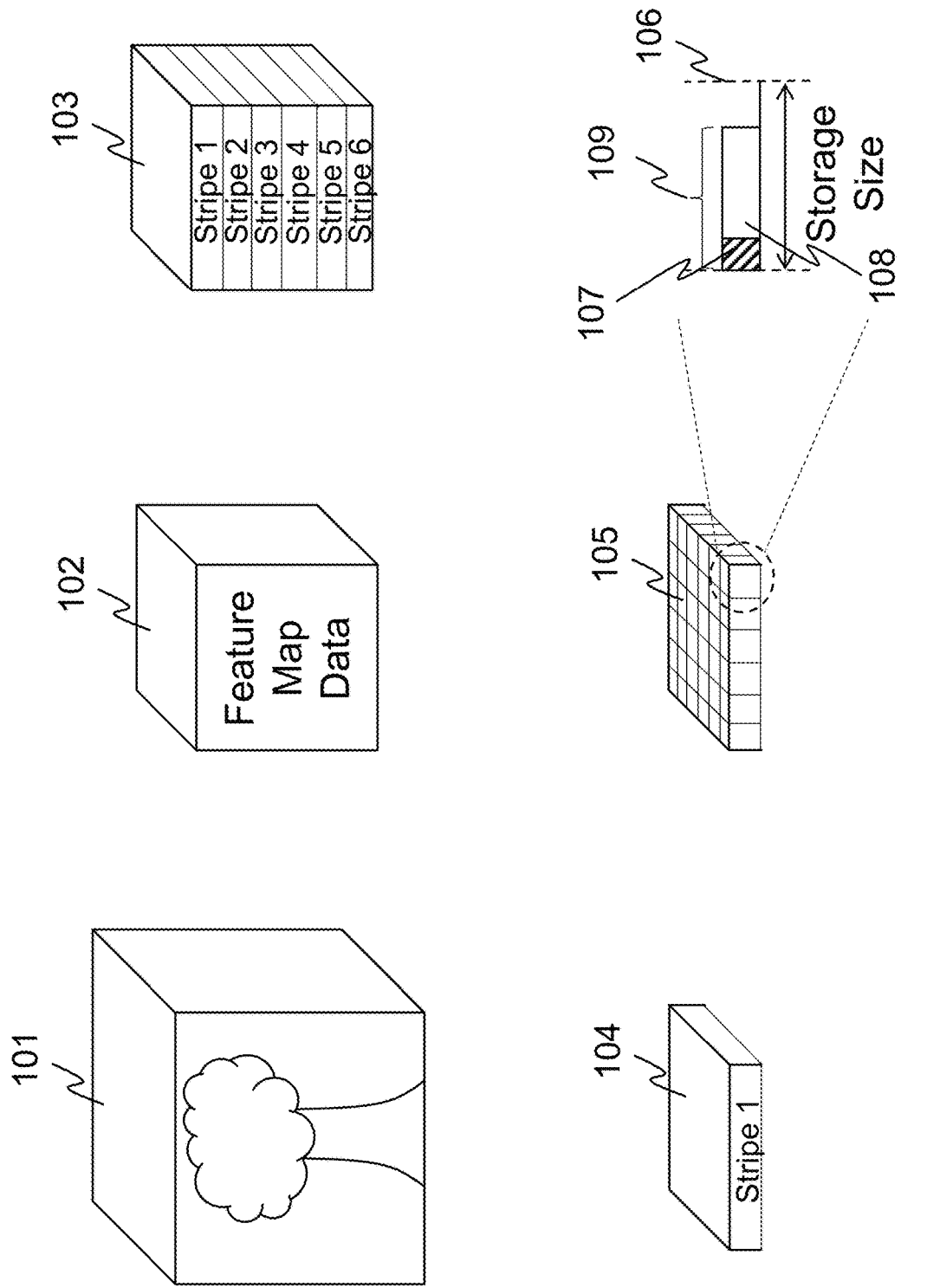
FIG. 1 illustrates a diagram of different types of feature map data at different stages of a data processing system processing a neural network in accordance with an example of the present disclosure.

Details of systems and methods according to examples will become apparent from the following description with reference to the figures. In this description, for the purposes of explanation, numerous specific details of certain examples are set forth. Reference in the specification to 'an example' or similar language means that a feature, structure, or characteristic described in connection with the example is included in at least that one example but not necessarily in other examples. It should be further noted that certain examples are described schematically with certain features omitted and/or necessarily simplified for the ease of explanation and understanding of the concepts underlying the examples. Herein, a computer-readable instruction, also referred to as an instruction, is a computer-readable instruction for one or more operations of processing circuitry.

Data processing systems which process neural networks, such as data processing systems comprising an NPU, typically comprise local storage circuitry and external storage circuitry. The local storage circuitry is used as a data buffer which temporarily stores data to be directly fetched for processing by processing circuitry and/or which temporarily stores data resulting from such processing. The external storage circuitry stores data which is to be transferred to and/or from the local storage circuitry. Typically, the external storage circuitry has a larger storage capacity than the local storage circuitry. In examples, the external storage circuitry has the capacity to store all of the input and/or output feature map data relating to a layer of the neural network while the local storage circuitry has the capacity to store only a portion of a layer's feature map data, at least in the case of some layers of a neural network.

The feature map data stored in the external circuitry to be transferred to the local storage circuitry in order to process a layer of the neural network is an input feature map (IFM). In examples, an IFM is stored in the form of feature map data representative of a feature map consisting of elements which have a height, width and depth dimension. For example, a dimension of the feature map is its width. A part of the width dimension is a part of the feature maps width. The dimensions of a part of the feature map or a part of the feature map dimensions, may be smaller than the dimensions of the feature map. The dimensions of a subpart of the feature map or a subpart of the feature map dimensions, may be smaller than the dimensions of a part of the feature map. A dimension of a part of the feature map, such as the width dimension, may be smaller than the width dimension of the whole of the feature map. The IFM will be traversed by transferring feature map data from the external storage circuitry to the local storage circuitry and then processing the locally-stored feature map data using neural network processing. The feature map data comprises a plurality of elements which are used to represent corresponding elements of the feature map. In examples, the feature map is derived from an image, where the feature map data comprises elements which represent pixel values of the image. The height and width dimensions of the feature map are representative of the x and y coordinates of a pixel in the image. The depth dimension of the feature map is representative of multiple parameter values associated with each pixel, such as intensity values which make up the different color channels. The color channels combine to make up the image, depth data, etc. Feature map data representing an entire feature map may be split into portions which are subsets of the feature map data, each representing contiguous elements of a part of the feature map. In examples, the portion of feature map data is a stripe of feature map data. Herein, a stripe of feature map data is referred to as a stripe for conciseness. The stripe is a portion of feature map data which is transferred to the local storage circuitry for processing. The stripe of feature map data represents a part of the feature map with dimensions such that the local storage size of the stripe is less than or equal to the storage space of the local storage circuitry allocated for feature map data processing. After processing, the processed IFM stripes or output feature map (OFM) stripes will then be transferred to the external storage circuitry.

Reducing the number and/or rate of external memory accesses, which includes reading from and writing to the external storage circuitry during data transfer, will reduce the power consumption of the data processing system. This can be achieved through compressing the feature map data being transferred to the external storage circuitry and then decompressing the data being transferred to the local storage circuitry such that it can be processed. Compressing sets of feature map data results in corresponding sets of compressed feature map data of varying data amounts, as the different elements in each set of feature map data lead to a varying amount of compression. However, storing the sets of compressed feature map data in external storage circuitry in sequence contigually, with their varying storage data amounts, would result in a relatively large number and/or rate of memory access procedures compared with direct memory access in which the feature map data is transferred by accessing a set of known predetermined storage addresses directly.

The number and/or rate of external memory accesses can also be reduced by rearranging the order in which feature map data of the neural network is processed relative to the order in which the layers of the neural network are arranged. For example, once a first OFM stripe is produced from a first process and stored in the local storage circuitry, to avoid a series of memory accesses it may again be fetched for a second process instead of transferred to external storage. This occurs if the arrangement of the neural network indicates that a later layer would result in the first OFM stripe being processed by the second process. The second process may result in the second OFM stripe being arranged differently in the external storage circuitry relative to the initial arrangement of the feature map data. The initial arrangement of the feature map data in external storage circuitry corresponds to the represented feature map and its dimensions. A flexible processing order of the neural network therefore requires a flexible method of accessing the data and is incompatible with current methods used to compress feature map data due to the data being accessed in a fixed sequence. The examples demonstrated in this disclosure offer a solution to the discussed problem of using compression and decompression during the processing of a neural network by a data processing system.

FIG. 1 illustrates a diagram of different types of feature map data at different stages of a data processing system processing a neural network in accordance with an example of the present disclosure. In examples, the data processing system comprises an NPU. The NPU comprises local storage circuitry and processing circuitry. In examples, the local storage circuitry is static random access memory (SRAM). The data processing system also comprises external storage circuitry where data is stored to be transferred to the local storage circuitry for processing. In examples, the external storage circuitry is dynamic random access memory (DRAM). The neural network is a convolutional neural network (CNN) which comprises convolution layers. Image 101 is processed by the CNN to identify features. The image 101 has pixel values which can be represented in height, width and depth dimensions of a feature map. The depth dimension of the corresponding feature map represents color channel values which combine to construct the image. In examples, the color channels are expressed as RGB (red, blue and green) intensity values but may be color values in a different color model. The feature map is represented by feature map data 102 comprising elements which represent pixel values of the image 101. The feature map data 102 has the pixel values arranged in height, width and depth dimensions and has a data size which represents the amount of storage space needed to store the uncompressed feature map data 102 in storage circuitry. The data size of the feature map data 102 is related to the dimensions of the feature map represented by the feature map data 102.

In examples, the feature map has dimensions 32 (height)× 32 (width)×64 (depth) which is represented by feature map data having a set of elements. Each element represents a pixel value of the image 101. The feature map dimensions represents how the pixels are arranged in the image 101. Each element has a data size of 8 bytes. The data size of the feature map data is therefore approximately 524 kilobytes.

In examples, the feature map data 102 is stored in DRAM and is an IFM. The feature map data 103 is broken down into a plurality of portions of feature map data which represent a part of the feature map having dimensions. In present examples, the portions of feature map data are stripes 103 the data sizes of which are determined by the storage capacity of the local storage circuitry or SRAM. It should be noted that although the demonstrated stripes are planar, in other examples, the stripes are taken vertically, from top to bottom. In examples, the represented part of the feature map dimensions and data size of each of the stripes 103 is identical. In examples, an IFM stripe is transferred to the SRAM for processing. From the processing, an OFM stripe 104 is generated and is temporarily stored in the SRAM. In examples, the IFM stripe is processed by convolving the IFM stripe with weight data to produce the OFM stripe 104. In other examples, processing the IFM stripe includes operating the IFM stripe with activation functions, pooling and deconvolution.

The OFM stripe 104 is transferred from the local storage circuitry to the external storage circuitry. In examples, this is achieved by using a direct memory access (DMA) which facilitates the reading and writing of data between the local storage circuitry and external storage circuitry. A portion of feature map data may be broken down further into subportions of feature map data. The OFM stripe 104 is transferred by being broken down into a set of subportions of the OFM stripe 105. Herein, subportions of feature map data are referred to as subportions for conciseness. The subportions 105 represent a subpart of the feature map dimensions where the dimensions in height, width and depth are determined by a predetermined format of subdivision. In examples, the predetermined format of subdivision is of certain dimensions, e.g. 8 h×16 w×16 d, and so each subportion has elements which represent the subpart of feature map of the same dimensions. The subportions of the OFM stripe 105 each have a data size related to the represented subpart of the feature map.

The set of subportions 105 are compressed to produce a plurality of sections of compressed feature map data. In examples, a section of compressed feature map data 106 comprises a block of data 109. The block of data 109 comprises header data 107 and payload data 108. The payload data 108 comprises the compressed subportion corresponding to the section of compressed feature map data 106. The header data 107 is indicative of one or more characteristics of the corresponding payload data 108.

In examples, each of the plurality of sections of compressed feature map data 106 has an equal external storage size, when stored in the external storage circuitry. The external storage size of the sections of compressed feature map data are at least equal to the combined data size of the header data 107 and the corresponding subportion before it is compressed. This is so that the external storage size for each of the plurality of sections of compressed feature map data is large enough to contain payload data 108 even if it comprises a uncompressed subportion. The external storage size for each of the plurality of the sections of compressed feature map data is equal even for varying blocks of data, data sizes. In other examples, the external storage size of the sections of compressed feature map data is selected to be equal to or larger than the combined data size of a minimum amount of header data 107 used to represent uncompressed subportion, and the full data size of a corresponding subportion before it is compressed. This is to ensure the combined data size of the header data and payload data never exceeds the external storage size of the section of compressed feature map data. The external storage size of the section of compressed feature map data may be larger than the combined data size of the header data 107 and payload data 108. Each of the sections of compressed feature map data has a constant external storage size as discussed previously such that each the plurality of sections of compressed feature map data have the same storage size. In examples, the sections of compressed feature map data when stored in external storage circuitry comprise a portion of storage size which is devoid of data. In other examples, the sections of compressed feature map data comprise a portion of storage size which contains zero-value data which is not accessed for transfer.

The external storage size of each of the plurality of sections of compressed feature map data 106 corresponds with an equal amount of associated allocated storage space in the external storage circuitry referred to herein as a "cell". Each of the plurality of cells in the external storage circuitry has an identical storage space equal to the external storage size of one of the plurality of sections of compressed feature map data such that the section of compressed feature map data can be stored in the cell in the external storage circuitry.

Figure 2:
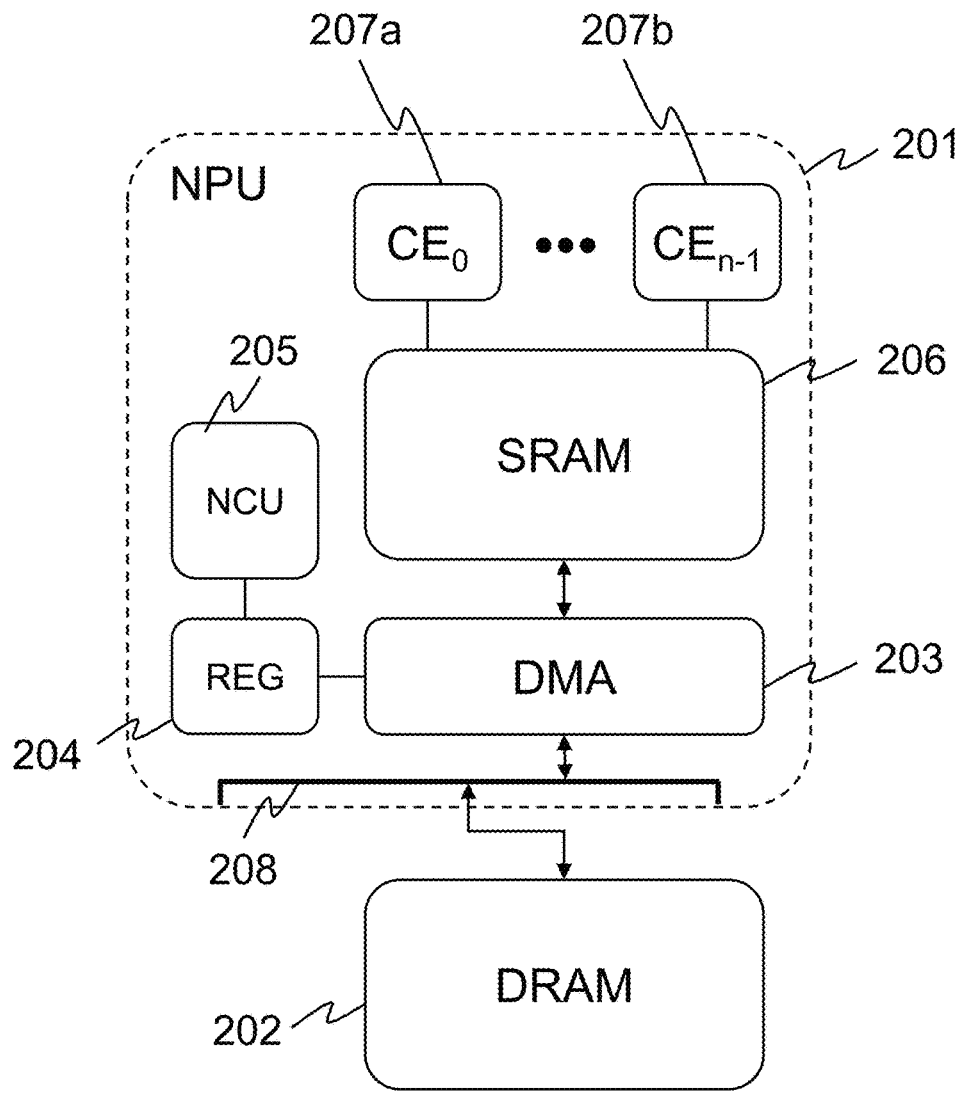
FIG. 2 illustrates a schematic block diagram representing a data processing system comprising an NPU and external storage circuitry in accordance with an example of the present disclosure.

FIG. 2 illustrates a schematic block diagram representing a data processing system comprising an NPU and external storage circuitry in accordance with an example of the present disclosure. The data processing system has external storage circuitry which is DRAM 202. The DRAM 202 is used to store feature map data and other data associated with the neural network such as weight data and instructions. The feature map data may be IFMs, OFMs, IFM stripes, OFM stripes, subportions of IFM stripes, subportions of OFM stripes and sections of compressed feature map data. The DRAM 202 is connected to the NPU 201 by a data transfer interface such as system bus 208. The NPU 201 comprises a DMA 203 which is connected to the DRAM 202 via the system bus 208 and SRAM 206 via a main data channel. The DMA 203 facilitates the reading and writing of data between the external DRAM 202 and SRAM 206. The SRAM 206 is used to store feature map data in the form of IFM stripes to be processed and OFM stripes after processing and other data associated with processing such as weight data, activation functions and pooling operations. The DMA also has a register 204 which can be set by a neural control unit (NCU) 205. The register 204 comprises a memory address register, byte count register and one or more control registers which are used to specify the source, destination, direction and the amount of the data transfer. The NCU generates control data for the hardware components of the NPU 201, such as the DMA 203 and compute engines 207a, 207b. In examples, other types of processing circuitry are used in place of the NCU, such as a CPU or GPU. The SRAM 206 is connected to a plurality of compute engines 207a, 207b. The compute engines 207a, 207b comprise multiply accumulate (MAC) compute engines (MCE) and programmable layer engines (PLE). MCEs are configured to perform convolutions between an IFM and weight data to generate an OFM. These convolutions may be broken down into IFM stripes and convolved with weight data to generate OFM stripes as discussed previously. PLEs are arranged to perform additional processing operations of the IFM, OFM, IFM stripes or OFM stripes including pool operations and applying activation functions. The PLE can also be programmed to perform a number of operations on different layers of the CNN, allowing for a broad range of CNN architectures to be implemented. In examples, the data processing system is configured for parallel processing. The SRAM 206 is configured to transfer feature map data for processing from a plurality of data buffers equal to the number of compute engines 207a, 207b with the DMA 203 configured to transfer the data to the plurality of data buffers.

Figure 3:
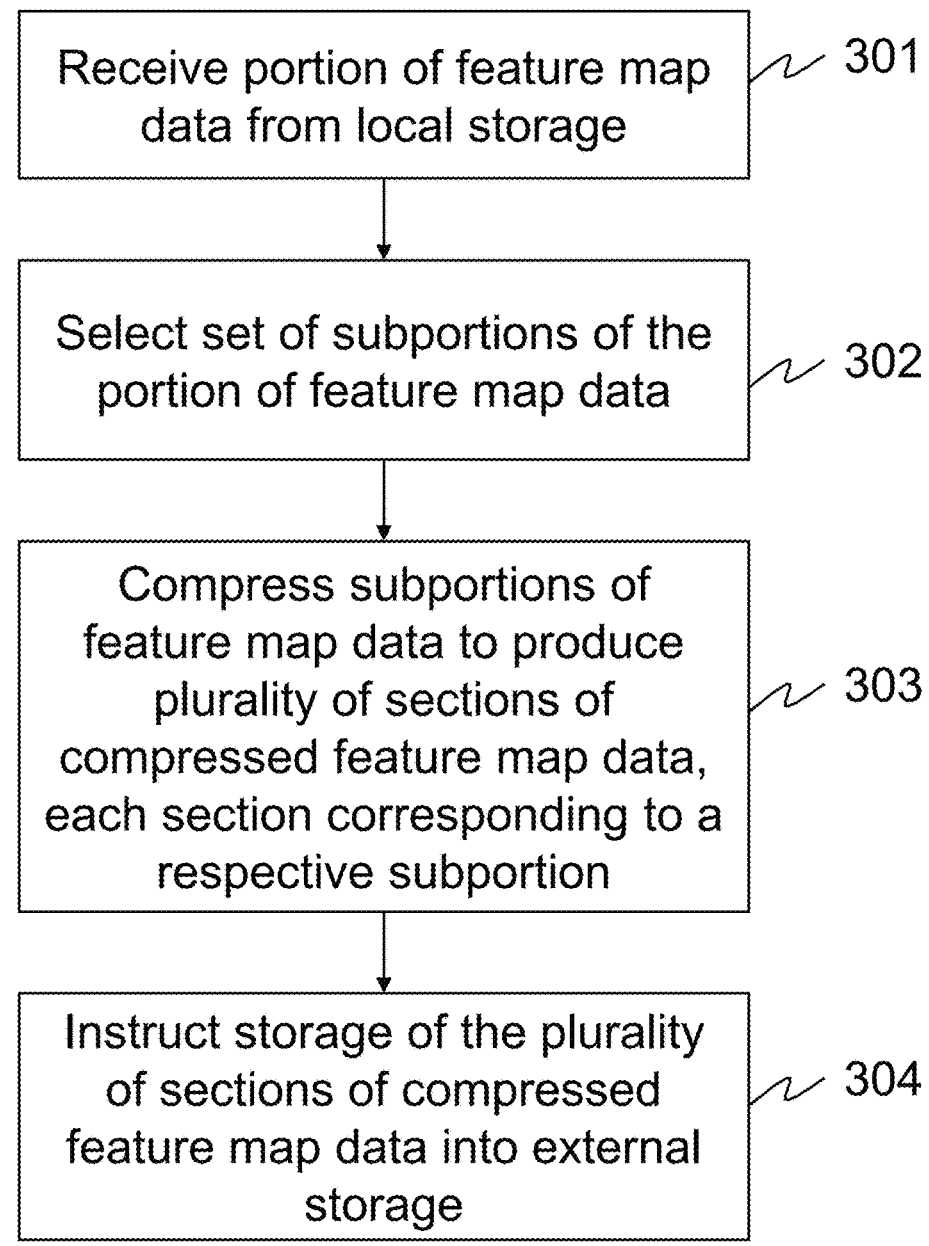
FIG. 3 illustrates a flow diagram representing a method of storing feature map data of a neural network in accordance with an example of the present disclosure.

FIG. 3 illustrates a flow diagram representing a method of storing feature map data of a neural network in accordance with an example of the present disclosure. In examples the neural network is processed using the data processing system previously conferred in the discussion of FIG. 2. At step 301 of the flow diagram a portion of feature map data is received from local storage circuitry. In examples, the portion of feature map data is an OFM stripe, generated by processing an IFM stripe of an earlier neural network layer. The OFM stripe is received by a DMA. The DMA facilitates the reading and writing of data between the DRAM and SRAM via the use of a main data channel. At step 302 of the flow diagram a set of subportions of the portion of feature map data is selected by the DMA. As demonstrated by FIG. 1, the OFM stripe 104 is broken down into a set of subportions 105. The subportions comprise subdivisions of contiguous elements of the stripe. The subportions 105 each represent a subpart of the feature map which corresponds to a predetermined format of subdivision. The predetermined format of subdivision is used to determine the height, width and depth of the subpart feature map represented by the subportions 105. The predetermined format of subdivision is selected from a plurality of predetermined formats of subdivision.

At step 303 of the flow diagram the subportions are compressed by the DMA to produce a plurality of sections of compressed feature map data, each section corresponding to a respective subportion. A subportion of feature map data is compressed using one or more compression techniques or methods to reduce the amount of data which is written to and read from external storage. In examples, the one or more compression techniques comprise lossless compression. Lossless compression ensures that no data is lost during compression such that on decompression the data can be restored to its original state. In examples, lossless compression comprises lossless variable length coding (VLC) such as Huffman encoding. In examples, the one or more compression techniques comprise removing zero-value elements from the subportion of feature map data. In other examples, the one or more compression techniques comprise dividing all elements in the subportion of feature map data by a common divisor. As demonstrated by FIG. 1, compressing the subportion of feature map data produces a block of data 109 which comprises payload data 108. The payload data 108 comprises the compressed subportion. In examples, the block of data also comprises additional data such as header data 107 which is generated by the DMA during the compression of the subportion. The header data 107 comprises data associated with the properties of the payload data 108. The header data 107 is used during the transfer of the sections of compressed feature map data. In examples, the header data 107 may comprise one or more uncompressed indicators which indicate if and where the payload data 108 comprises contiguous regions of uncompressed elements. The header data also comprises a data element indicative of the data size of the payload data 108.

At step 304 of the flow diagram the DMA instructs the storage of the plurality of sections of compressed feature map data into external storage. Each of the plurality of sections of compressed feature map data has a corresponding cell in the external storage circuitry. The cells have an allocated storage space equal to the external storage size of each section of compressed feature map data. The plurality of cells each have equal storage space. In examples, the DMA instructs the storage of the plurality of sections of feature map data into the plurality of cells in the DRAM by transferring the sections of compressed feature map data using a data stream. The data stream comprises a sequence of the plurality of header data and corresponding payload data of variable data size. Each of the payload data comprises compressed subportions which have variable data sizes corresponding to how much the subportions were compressed during compression. In examples, the sequence of the header data and payload data in the data stream is different to the order in which the DMA received the header data and payload data. The data stream ensures that the associated external storage size of each section of compressed feature map data is used to store the corresponding header data and payload data for each of the plurality of sections of compressed feature map data in cells in the external storage circuitry.

In examples, this method can be used to transfer an OFM stripe stored in the local storage to the external storage where it is stored. The OFM stripe related to one neural network layer is stored in the external storage where it is transferred back to the local storage to be processed as an IFM stripe of a different neural network layer.

Figure 4:
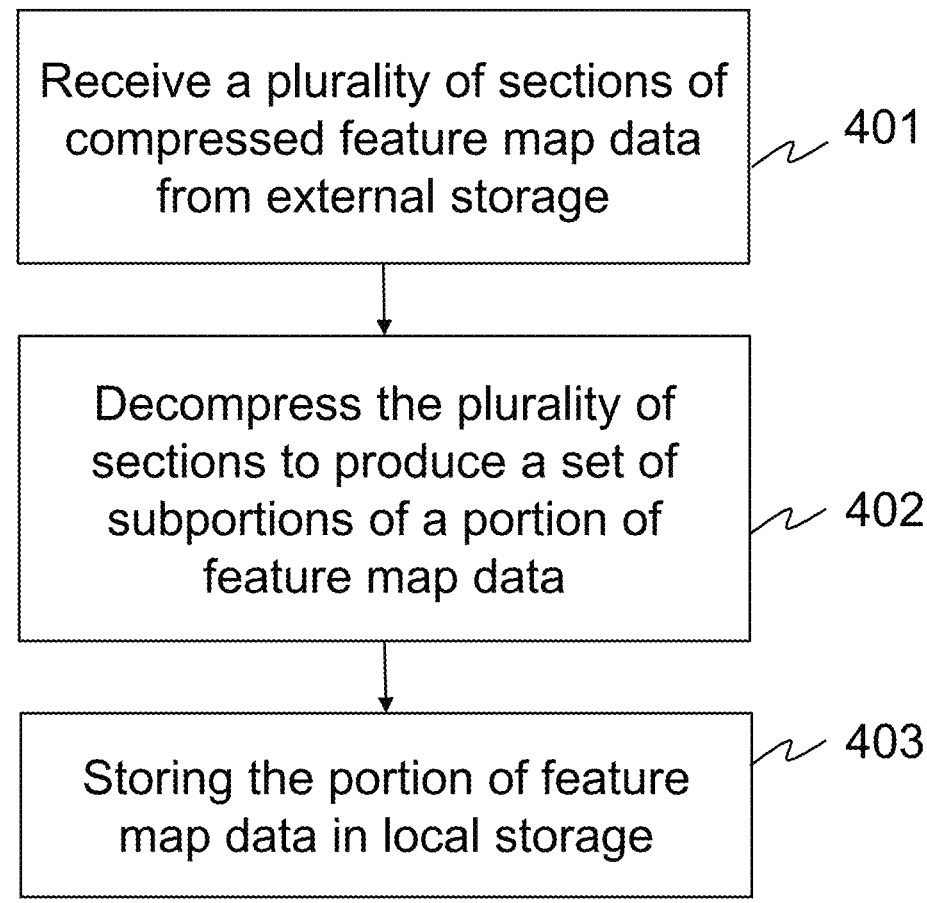
FIG. 4 illustrates a flow diagram representing a method of receiving feature map data of a neural network in accordance with an example of the present disclosure.

FIG. 4 illustrates a flow diagram representing a method of receiving feature map data of a neural network in accordance with an example of the present disclosure. In examples, the neural network is processed using the data processing system previously discussed in FIG. 2. At step 401 of the flow diagram the DMA receives a plurality of sections of compressed feature map data from external storage. In examples, the sections of compressed feature map data were previously stored in cells in the external storage circuitry using the method demonstrated in the discussion of FIG. 3. In other examples, the plurality of sections of compressed feature map data to be received from the external storage represent a different respective part of the feature map to the plurality of sections of compressed feature map data which were previously transferred to the external storage circuitry from the local storage circuitry. In examples, the DMA may retrieve the plurality of sections of compressed feature map data by instructing the DRAM to transfer of the plurality of sections of compressed feature map data in a data stream as previously discussed.

In examples, the DMA retrieves the sections of compressed feature map data from the external storage circuitry using the address data within the header data. The address data represents addresses of the plurality of subportions contained in the sections of compressed feature map data. The addresses correspond to the location of the subparts of the feature map which the subportions represent within the feature map. The addresses may be used by the DMA to receive the sections of the compressed feature map data in the same order as the subportions are found in the part of the feature map which they represent.

At step 402 the DMA decompresses the plurality of sections of feature map data to produce a set of subportions of a portion of feature map data. In examples, the plurality of sections of feature map data comprise a corresponding plurality of blocks of data. The blocks of data comprise payload data and header data. As demonstrated by FIG. 1, the header data 107 precedes the payload data 108 such that the header data 107 is read before the payload data 108. As discussed previously, the header data comprises a data element indicative of the data size of the payload data comprising the section of compressed feature map data. This indicates to the DMA, how much of the section of compressed feature map data to read, to retrieve the payload data for decompression. The data element is used to ensure that the payload data is read for decompression. In examples the header data comprises compression data which indicates how the payload data comprising compressed subportions was compressed. The compression data is used to inform the decompression process of the payload data to produce the corresponding subportion data. The produced plurality of subportions will be identical to the plurality of subportions which were initially compressed during the transfer of the plurality of subportions to the external storage circuitry. This is due the use of lossless compression techniques. In examples, the one or more compression techniques comprise the removal of zero-value elements from the subportions of feature map data to produce compressed feature map data during compression. The header data comprises compression data indicating where zero-value elements are to be returned to the payload data during the decompression.

At step 403 the DMA stores the portion of feature map data in local storage. The DMA ensures that the subportions of feature map data produced from decompressing the payload data are written to the SRAM in an order such that they combine to form the IFM stripe in the SRAM which is then fetched for processing. This may be achieved using address data.

Figure 5:
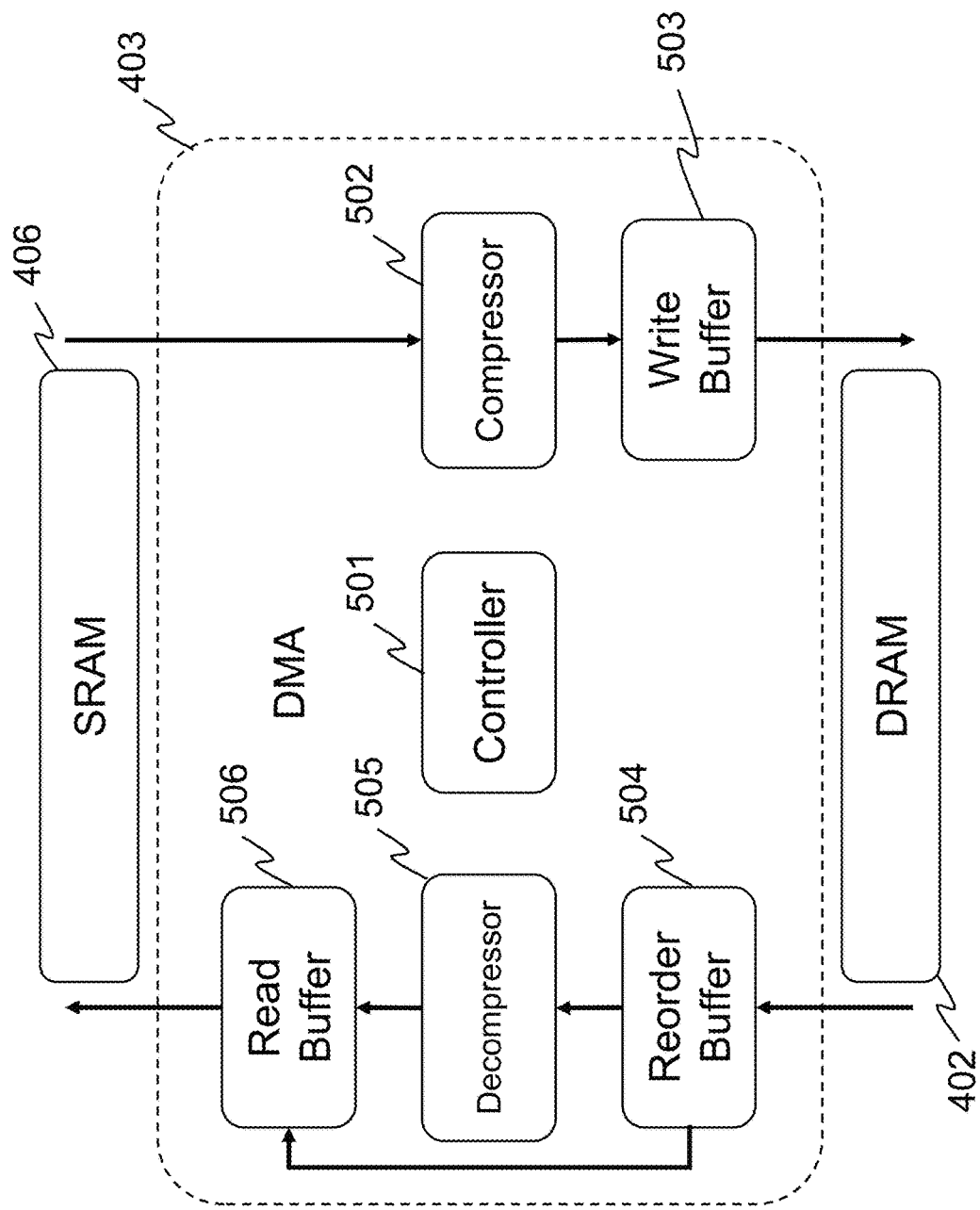
FIG. 5 illustrates a schematic block diagram representing storage circuitry comprising a compressor and a decompressor in accordance with an example of the present disclosure.

FIG. 5 illustrates a schematic block diagram representing storage circuitry comprising a compressor and a decompressor in accordance with an example of the present disclosure. In examples, the storage circuitry is a DMA. In examples, the DMA 403 is contained within the data processing system discussed previously in FIG. 2. The DMA 403 comprises a controller 501 which generates control data for the hardware components of the DMA 403. In examples, the controller 501 generates control data according to control data generated by the NCU.

The controller 501 generates control data for the DMA 403 to receive feature map data from the SRAM 406. In examples, the feature map data being received from the SRAM 406 is an OFM stripe. The OFM stripe is retrieved from the SRAM 406 and transferred to the compressor 502. In examples, the compressor comprises a compressor buffer where the OFM stripe is split into a plurality of subportions of feature map data representing subparts of the feature map with equal dimensions. Each subportion of feature map data may be given a corresponding address by the DMA which is generated from the position of the subpart of the feature map within the feature map which the subportion represents. The address is used to recall the subportion of feature map data and related feature map data types such as corresponding sections of compressed feature map data.

Each of the plurality of subportions of feature map data represents a subpart of a feature map with height, width and depth dimensions. The represented subpart of the feature map dimension is equal for each subportion of feature map data with each subportion representing a different subpart of the feature map. The represented subpart of the feature map is selected using a predetermined format of subdivision. This predetermined format of subdivision is selected using software which is executed by the data processing system prior to the processing of the neural network. The software when executed by a processor selects the predetermined format of subdivision based on a property of the neural network layer associated with the feature map data being transferred. In examples, the software, when executed by a processor, selects a predetermined format of subdivision based on the predetermined dimensions of a selection of OFM data of the neural network layer. The selection of OFM data is an OFM stripe which represents a portion of an output feature map with dimensions, the output feature map resulting from a feature map being processed. The represented portion of output feature map corresponds to the storage size of the OFM stripe. In a further example, the software, when executed by the processor, selects the predetermined format of subdivision based on the position of the layer being processed in a sequence of layers. The neural network comprises the sequence of layers.

In examples, the neural network is processed by the data processing system by executing a set of instructions where an instruction implements a layer of the neural network. The set of instructions has a sequence which is used to determine the sequence of neural network layers in the neural network. It should be noted that even if the neural network layers are processed out of order, the initial position of the neural network layer in the set of instructions is used to select the predetermined format of subdivision. Earlier layers of neural networks have feature map data which represents a part of the feature map that is shallow, wide and deep and later layers of neural networks have feature map data which represents a part of the feature map which is shallow and thin but deeper than the dimensions of feature maps of earlier layers.

In examples, the software used to select the predetermined format of subdivision is a compiler. The compiler processes source code or assembly code implementing a neural network with layers to determine a set of instructions used by hardware components to carry out processes during clock cycles of the data processing system. The set of instructions comprise instructions related to each layer of the neural network. The instructions related to each layer of the neural network are used by the hardware components of the data processing system, such as the DMA, to schedule the transfer of the feature map data between local storage and external storage during the processing of the layer of the neural network. In examples, the instructions related to each layer of the neural network comprise subdivision parameters indicating the selected predetermined format of subdivision for the layer of the neural network. The subdivision parameters are used by the DMA to determine the dimensions of the subpart of the feature map which the subportions represent. This also determines the storage size of the subportions of feature map data as the represented dimensions of the subpart of the feature map are related to the storage size of the subportions.

The plurality of subportions are compressed using the compressor 502 to generate a plurality of sections of compressed feature map data in which each section of compressed feature map data corresponds to a subportion. The plurality of sections of compressed feature map data comprise a plurality of header data with each header data corresponding to a section of compressed feature map data. The plurality of sections of compressed feature map data also comprise a plurality of payload data. The payload data comprises the corresponding compressed subportions. The payload data and corresponding header data form a block of data. The compressor generates the sections of compressed feature map data such that they have a storage size which is larger than the combined data size of the header data and subportion of compressed feature map data before compression. Each of the plurality of sections of compressed feature map data have equal storage size. The header data comprises a data element indicating the data size of the corresponding payload data. The header data also comprises an uncompressed indicator which indicates contiguous portions of uncompressed feature map data within the payload data. The header data further comprises address data corresponding to the position of the subpart of the feature map within the feature map representing the subportion of feature map data. The header data also comprises compression data corresponding to the one or more compression techniques used to produce the payload data. The compression data is used to decompress the payload data when it is transferred to the decompressor.

The plurality of sections of compressed feature map data are then transferred to the write buffer 503. The write buffer 503 generates a data stream comprising a sequence of header data and payload data which is used to write the plurality of sections of compressed feature map data to the DRAM 402. In examples, the write buffer 503 writes the plurality of sections of compressed feature map data into a plurality of cells within the DRAM 402. Each of the plurality of cells has a storage space equal to the storage size of each of the plurality of sections of compressed feature map data.

The controller 501 generates control data to receive feature map data from the DRAM 402. In examples, the received feature map data is an IFM stripe comprising of a plurality of sections of compressed feature map data. As discussed previously, the plurality of sections of compressed feature map data can originate from an OFM stripe of a previous layer of the neural network transferred from the SRAM 406. The OFM stripe of a previous layer of the neural network can be an IFM stripe of a later layer of the neural network within the sequence of layers of the neural network. The plurality of sections of compressed feature map data may also correspond to initial feature map data representing the initial feature map input into the neural network. In examples, an IFM stripe comprising a portion of the initial feature map data is compressed to generate the plurality of sections of compressed feature map data externally to the data processing system and transferred to the DRAM 402 by a computer communicatively coupled to the data processing system.

In examples, the plurality of sections of compressed feature map data is stored in the DRAM 402 in a plurality of cells. The controller 501 instructs the transfer of the plurality of sections of compressed feature map data from the plurality of cells within the DRAM 402 to the decompressor 505 in a data stream comprising a sequence header data and payload data, as discussed previously. The data stream is used to read the sections of compressed feature map data from the DRAM 402 and transfer it to the decompressor 505.

Figure 6:
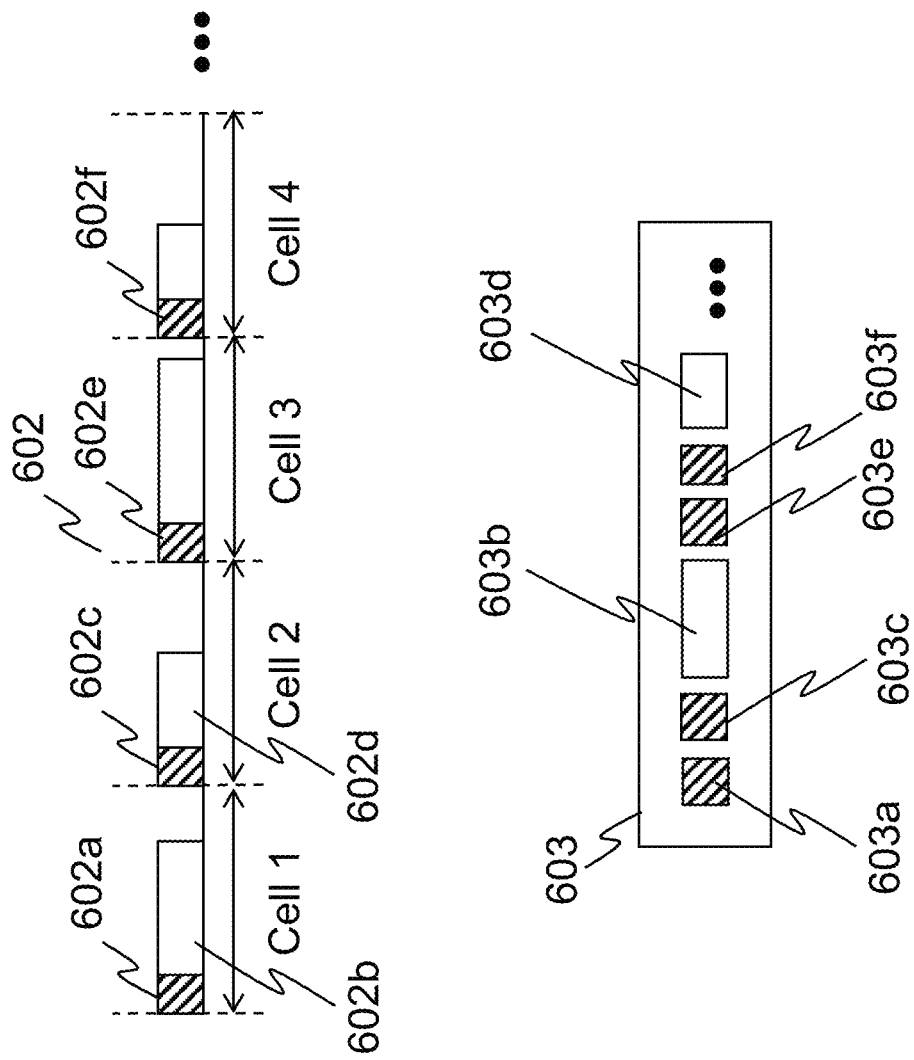
FIG. 6 illustrates a schematic block diagram representing a method of transferring feature map data from DRAM to SRAM in accordance with an example of the present disclosure.

FIG. 6 illustrates a schematic block diagram representing a method of transferring feature map data from DRAM to SRAM in accordance with an example of the present disclosure. The cell arrangement 602 demonstrates a representation of the sections of compressed feature map data stored in cells which contain the sections of compressed feature map data in the external storage circuitry. Each of the plurality of sections of compressed feature map data comprise header data 602*a*, 602*c*, 602*e*, 602*f* and corresponding payload data 602*b*, 602*d* which form blocks of data. The payload data is variable in data size due to the varying degrees of compression. The sections of compressed feature map data may each have a storage size which is larger than the data size of the corresponding block of data, as shown in FIG. 6. Each of the cells have a storage space equal to the storage size of the sections of compressed feature map data. The sections of compressed feature map data when stored in the cells comprise a portion of storage size which is devoid of data which is not transferred in the data transfer process.

The sections of compressed feature map data contained in the cell arrangement 602 is transferred to the reorder buffer 504 of FIG. 5 across a data transfer interface such as a system bus. The reorder buffer 504 uses the cell arrangement 602 to produce a data stream 603. The data stream 603 comprises a sequence of blocks of data with variable sizes. The reorder buffer 504 uses the data element indicative of the data size of the payload data within the header data to ensure that the data stream comprises only of the header data and payload data where the total data size of the data stream is equal to the combined data size of the plurality of header data and payload data as indicated by the data stream 603 of FIG. 6. In examples, the portion of storage size which is devoid of data contained within the cell is not transferred in the data stream.

The reorder buffer 504 is also used to reorder the header data and payload data from the cell arrangement 602 in the data stream 603. There is a long latency associated with reading data from the DRAM which can be hundreds of clock cycles long. The reorder buffer 504 arranges the sequence of the header data and payload data in the data stream 603 such that a sequence of consecutive header data can be read during long latency periods so that clock cycles are not wasted. As indicated in the data stream 603 of FIG. 6, the header data and payload data in the cell arrangement 602 are rearranged by the reorder buffer 504 such that the header data 603a of cell 1 and the header data 602c of cell 2 precede the payload data 602b of cell 1 and the header data 603e of cell 3 and the header data 602f of cell 4 precede the payload data 602d of cell 2. This is so that the latency period associated with reading the payload data 603b of cell 1 is utilized by reading the header data 603a of cell 1 and header data 603c of cell 2. The latency associated with reading the compressed feature map data 603d of cell 2 is also utilized by reading the header data 603e of cell 3 and header data 603f of cell 4.

In examples, the data stream 603 comprises a consecutive sequence of a larger number of header data between each payload data than demonstrated in FIG. 6. In other examples, the data stream 603 comprises a consecutive sequence of a higher number of header data at the start of the reordered data stream relative to the consecutive sequence of header data read between each payload. This is to ensure that the read header data is always ahead of the payload data. In further examples, the reordered data stream comprises a consecutive sequence of header data followed by a consecutive sequence of payload data. In other examples, the data stream comprises a sequence of 3 header data followed by 3 payload data.

As demonstrated by FIG. 5, the reorder buffer 504 uses the uncompressed indicators within the header data to determine if the corresponding payload data comprises a subportion of feature map data which has not been compressed so that the payload data can be rerouted past the decompressor 505 to the read buffer 506. In examples, this may be achieved using a data stream comprising the header data and payload data of uncompressed feature map data. As demonstrated by FIG. 5 and FIG. 6 the data stream 603 is used to transfer the header data and corresponding payload data from the DRAM 402 to the decompressor 505 where it is decompressed. The decompressor uses compression data which is related to the compression of the compressed feature map data within the header data to determine how to decompress the compressed feature map data to produce the corresponding subportion which is then transferred to the read buffer 506. The decompressor 505 also uses the address data within the header data to ensure the subportions are transferred to the SRAM in an order such as to construct the IFM stripe. In examples, the subportions are reordered in the read buffer 506. The plurality of subportions are transferred from the read buffer 506 to the SRAM 406 such that the IFM stripe is stored in the SRAM 406 for processing.

Figure 7:
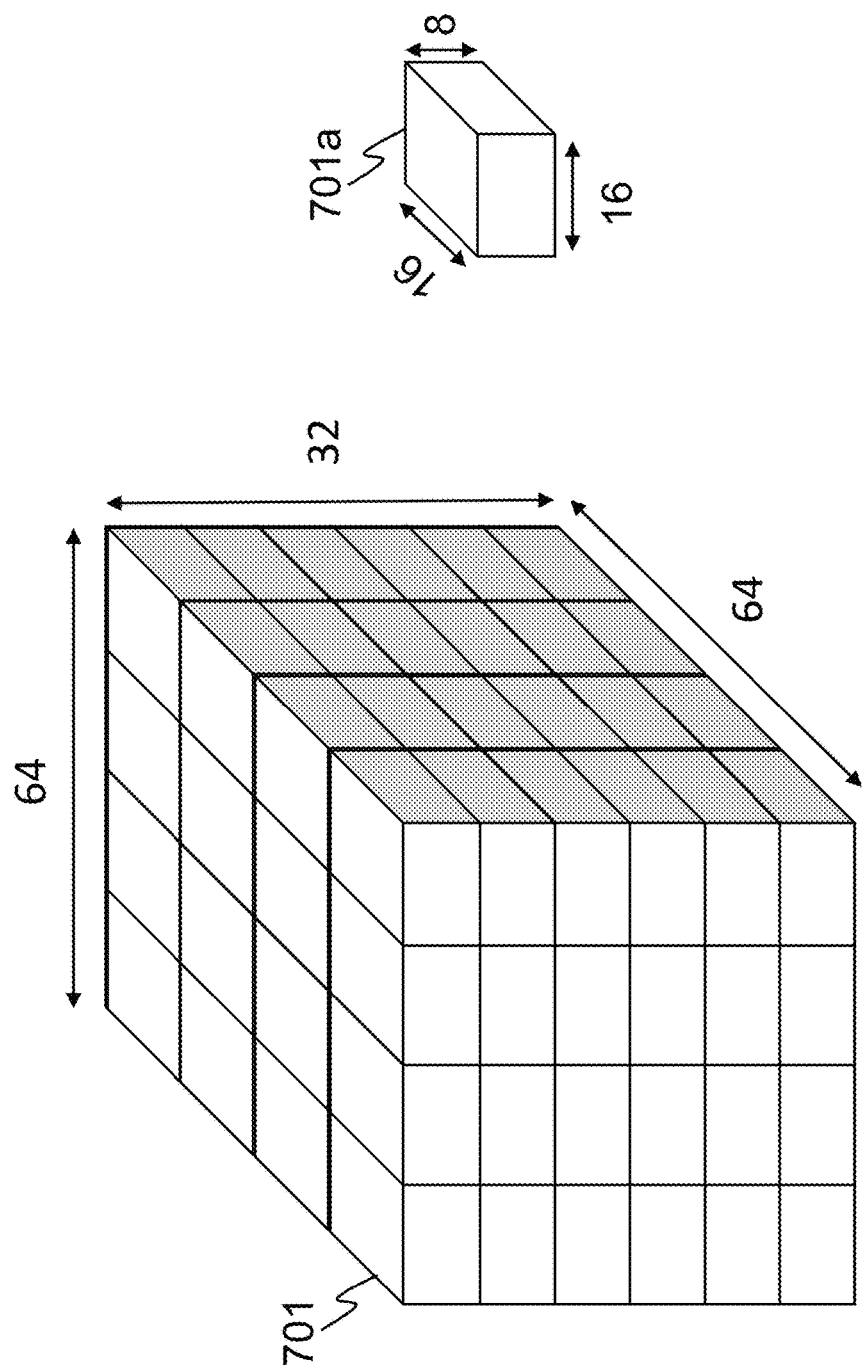
FIG. 7 illustrates a diagram representing a part of a feature map and a first predetermined format of subdivision in accordance with an example of the present disclosure.

FIG. 7 illustrates a diagram representing a part of a feature map and a first predetermined format of subdivision in accordance with an example of the present disclosure. A part of a feature map 701 has dimensions of e.g. 32 h×64 w×64 d and is represented by a portion of feature map data. As discussed previously, the portion of feature map data representing the part of the feature map is broken down into subportions of feature map data using a predetermined format of subdivision which is selected from a plurality of predetermined formats of subdivision. Each of the plurality of predetermined formats of subdivision has dimensions representative of a subpart of the feature map.

If a dimension of the predetermined format is not selected appropriately, the part of the feature map for a layer of the neural network may have subportions of feature map data which represent only a small number of elements at the extremities of each part of the feature map. This is because the dimensions of the part of the feature map may not be completely divisible by the selected predetermined format of subdivision. During the data transfer process discussed previously, the subportions of feature map data are compressed to produce sections of compressed feature map data which are stored in cells in external storage circuitry. The sections of compressed feature map data which comprise only a small number of elements when transferred by the data processing system cause it to consume a large amount of power relative to the amount of data transferred. The plurality of predetermined formats of subdivision may be determined through modelling the processing of the neural network by the data processing system, with different formats of subdivision and selecting the formats of subdivision which reduce the amount of power consumed by the data processing system.

In examples, the plurality of predetermined formats of subdivisions comprise a wide format 701a. Each subportion of feature map data in the wide format 701a represents a subpart of the feature map with dimensions of e.g. 8 h×16 w×16 d. The part of the feature map 701 with dimensions of e.g. 32 h×64 w×64 d is therefore represented by a given number of, e.g. 96 subportions using this predetermined format of subdivision. The wide format is used for earlier neural network layers of the neural network where the feature map data is shallow, wide and deep.

Figure 8:
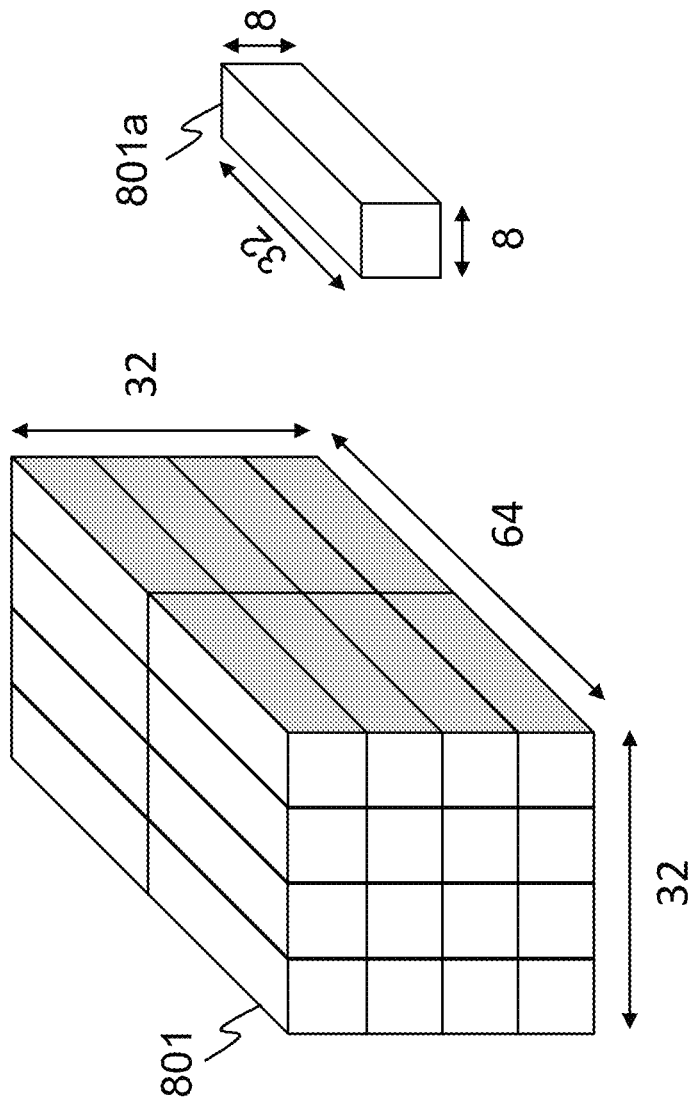
FIG. 8 illustrates a diagram representing a part of a feature map and a second predetermined format of subdivision in accordance with an example of the present disclosure.

FIG. 8 illustrates a diagram representing a feature map and a second predetermined format of subdivision in accordance with an example of the present disclosure. A part of a feature map 801 has dimensions of e.g. 32 h×32 w×64 d and is represented by a portion of feature map data. In examples, the plurality of predetermined formats of subdivisions comprise a deep format 801a. Each subportion of feature map data in the deep format 801a represents a subpart of the feature map with dimensions of e.g. 8 h×8 w×32 d. The part of the feature map 801 with dimensions of e.g. 32 h×64 w×64 d is therefore represented by a given number of, e.g. 32, subportions with this predefined format of subdivision. This is less than the number of subportions used for earlier layers. The deep format is used for later neural network layers of the neural network where the feature map is shallow and thin, but deeper relative to feature maps of earlier layers of the neural network.

The subsections of compressed feature map data and corresponding cells provide a unitary storage size and storage space to/from which data can be transferred flexibly. Even though the blocks of data comprising the sections of compressed feature map data are of a variable data size, because they are contained within sections of compressed feature map data with the same fixed storage size and then stored in cells which have a fixed storage space, each block of data can be arranged flexibly in storage circuitry to be accessed in a sequence. Compressed feature map data arranged in the external storage circuitry without the use of unitary storage sizes has an arrangement which is costly in terms of the number memory accesses which are used to retrieve it in a sequence. By arranging the compressed feature map data in unitary storage spaces, the number of memory accesses is reduced. The unitary storage size also allows parts of the feature map to be retrieved and processed flexibly. This reduces the memory bandwidth used by a data processing system to process a neural network.

Whilst in the above examples, feature maps, and portions of feature maps, are shown in three dimensions, it is to be understood that the invention applies to feature maps which comprise any number of dimensions. Whilst in the above examples, the data processing system is shown as having an NPU, it is to be understood that the invention applies to other processing circuitry such as a CPU or GPU which is used to process neural networks. Whilst in the above examples, the external storage circuitry is shown as being DRAM, it is to be understood that the invention applies to other external storage circuitry types. Whilst in the above examples, the local storage circuitry is shown as being SRAM, it is to be understood that the invention applies to other local storage circuitry types. Whilst in the above examples, the storage circuitry which facilitates the reading and writing of data between the local storage circuitry and external storage circuitry is shown as being a DMA, it is to be understood that the invention applies to other storage circuitry types which can be used to mediate the transfer of data.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the disclosure, which is defined in the accompanying claims.

What is claimed is:

1. A computer implemented method of storing and retrieving feature map data of a neural network the method comprising transferring feature map data between local storage and external storage by:
   receiving a first portion of feature map data from the local storage, the first portion of feature map data being representative of a respective first part of a feature map, the feature map having at least height, width and depth dimensions;
   selecting a first set of subportions of the first portion of feature map data;
   compressing the subportions of feature map data to produce a first plurality of sections of compressed feature map data, each section corresponding to a respective subportion;
   instructing the storage of the first plurality of sections of compressed feature map data into the external storage;
   receiving a second plurality of sections of compressed feature map data from the external storage, the second plurality of sections corresponding to a second portion of feature map data, the second portion of feature map data being representative of a respective second part of the feature map;
   decompressing the second plurality of sections to produce a second set of subportions of the second portion of feature map data; and
   storing the second portion of feature map data in local storage,
   wherein the first and second sets of subportions each correspond to a predetermined format of subdivision, in terms of height, width and depth, of the feature map and the method comprises selecting the predetermined format of subdivision from a plurality of predetermined formats of subdivision based on a property of a neural network layer associated with the feature map data being transferred, wherein the property of the neural network layer comprises predetermined dimensions of a selection of output feature map data of the neural network layer or a position of the neural network layer within a sequence of neural network layers.

2. The method of claim 1, comprising transferring feature map data for a plurality of different neural network layers, and selecting a first predetermined format of subdivision for a first neural network layer and selecting a second, different predetermined format of subdivision for a second, different neural network layer.

3. The method of claim 1, wherein the first part of the feature map and the second part of the feature map comprise different respective parts of the feature map.

4. The method of claim 1, wherein compressing the subportions of feature map data comprises a lossless compression method.

5. The method of claim 1, wherein the method comprises using storage circuitry to:
   obtain a first plurality of addresses to the first plurality of sections of compressed feature map data;
   use the first plurality of addresses to instruct the storage of the first plurality of sections of compressed feature map data into external storage;
   obtain a second plurality of addresses to the second plurality of sections of compressed feature map data;
   use the second plurality of addresses to receive the second plurality of sections of compressed feature map data from the external storage.

6. The method of claim 1, wherein receiving the second plurality of sections of compressed feature map data from the external storage comprises receiving the second plurality of sections of compressed feature map data as a sequence of variable blocks of data in a data stream.

7. The method of claim 6, wherein each of the second plurality of sections of compressed feature map data comprises header data, wherein the header data is indicative of one or more characteristics of the corresponding compressed feature map data.

8. The method of claim 7, wherein the sequence of variable blocks of data comprises header data followed by compressed feature map data.

9. The method of claim 7, wherein the sequence of variable blocks of data comprises first header data, followed by second header data, followed by compressed feature map data.

10. The method of claim 7, wherein the header data comprises a data element indicative of the size of the compressed feature map data in a section.

11. The method of claim 7, wherein the header data comprises an uncompressed indicator indicative of portions of uncompressed feature map data within the compressed feature map data.

12. A non-transitory computer-readable storage medium comprising a set of computer-readable instructions stored thereon which, when executed by at least one processor, cause the at least one processor to:

select a predetermined format of subdivision in terms of height, width and depth of a feature map having at least height, width and depth dimensions, from a plurality of predetermined formats of subdivision, corresponding to a first set of subportions of a first portion of feature map data of a neural network, the first portion of feature map data being representative of a first part of the feature map, wherein the predetermined format of subdivision is selected based on a property of a neural network layer associated with the feature map data to be transferred, wherein the property of the neural network layer comprises predetermined dimensions of a selection of output feature map data of the neural network layer or a position of the neural network layer within a sequence of neural network layers; and schedule the transfer of the feature map data between local storage and external storage using the selected predetermined format of subdivision;

wherein the feature map data of the neural network is to be transferred between local storage and external storage by:

receiving the first portion of feature map data from the local storage;

selecting the first set of subportions of the first portion of feature map data;

compressing the subportions of feature map data to produce a first plurality of sections of compressed feature map data, each section corresponding to a respective subportion;

instructing the storage of the first plurality of sections of compressed feature map data into external storage;

receiving a second plurality of sections of compressed feature map data from the external storage, the second plurality of sections corresponding to a second portion of feature map data, the second portion of feature map data being representative of a respective second part of the feature map;

decompressing the second plurality of sections to produce a second set of subportions of the second portion of feature map data; and storing the second portion of feature map data in local storage.

13. The storage medium of claim 12, wherein the set of instructions when executed by at least one processor, cause the processor to select the predetermined format of subdivision from the plurality of predetermined formats of subdivision, the plurality of predetermined formats of subdivision comprising a wide format and a deep format, the wide format width dimensions being larger relative to the deep format width dimensions and the deep format depth dimensions being larger relative to the wide format depth dimensions.

14. The storage medium of claim 12, wherein the set of instructions, when executed by at least one processor, cause the processor to select the predetermined format of subdivision based on the predetermined dimension of a selection of output feature map data of the neural network layer, the selection of output feature map data being representative of a part of an output feature map, the output feature map having at least height, width and depth dimensions, wherein the selection of output feature map data is the result of the portion of feature map data being processed during processing of the neural network layer.

15. The storage medium of claim 12, wherein the set of instructions when executed by at least one processor, cause the processor to select the predetermined format of subdivision based on the position of the neural network layer associated with the feature map data in a sequence of neural network layers, wherein the neural network comprises the sequence of neural network layers.

16. A data processing system comprising local storage circuitry and external storage circuitry arranged to store feature map data of a neural network, and processing circuitry arranged to:

receive a first portion of feature map data from the local storage, the first portion of feature map data being representative of a respective first part of a feature map, the feature map having at least height, width and depth dimensions;

select a first set of subportions of the first portion of feature map data;

compress the subportions of feature map data to produce a first plurality of sections of compressed feature map data, each section corresponding to a respective subportion;

instruct the storage of the first plurality of sections of compressed feature map data into the external storage;

receive a second plurality of sections of compressed feature map data from the external storage, the second plurality of sections corresponding to a second portion of feature map data, the second portion of feature map data being representative of a respective second part of the feature map;

decompress the second plurality of sections to produce a second set of subportions of the second portion of feature map data; and store the second portion of feature map data in local storage, wherein the first and second sets of subportions each correspond to a predetermined format of subdivision, in terms of height, width and depth, of the feature map and selecting the predetermined format of subdivision from a plurality of predetermined formats of subdivision is based on a property of a neural network layer associated with the feature map data being transferred, wherein the property of the neural network layer comprises predetermined dimensions of a selection of output feature map data of the neural network layer or a position of the neural network layer within a sequence of neural network layers.

* * * * *